US 9,330,593 B2

(12) United States Patent
Jang (10) Patent No.: US 9,330,593 B2
(45) Date of Patent: May 3, 2016

(54) STAGE CIRCUIT AND ORGANIC LIGHT EMITTING DISPLAY USING THE SAME

(71) Applicant: Hwan-Soo Jang, Yongin (KR)

(72) Inventor: Hwan-Soo Jang, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 184 days.

(21) Appl. No.: 13/771,385

(22) Filed: Feb. 20, 2013

(65) Prior Publication Data

US 2014/0078029 A1    Mar. 20, 2014

(30) Foreign Application Priority Data

Sep. 20, 2012  (KR) .......... 10-2012-0104512

(51) Int. Cl.
| | | |
|---|---|---|
| *G09G 3/36* | (2006.01) | |
| *G09G 3/22* | (2006.01) | |
| *H03L 7/00* | (2006.01) | |
| *G09G 3/32* | (2016.01) | |

(52) U.S. Cl.
CPC .. *G09G 3/22* (2013.01); *G09G 3/32* (2013.01); *H03L 7/00* (2013.01)

(58) Field of Classification Search
CPC ............ G09G 3/3677; G09G 2310/0286
USPC ............................................. 345/98–100
See application file for complete search history.

(56) References Cited

U.S. PATENT DOCUMENTS

| | | | |
|---|---|---|---|
| 8,553,026 B2* | 10/2013 | Park .......... | G09G 3/3266 345/212 |
| 2008/0062097 A1* | 3/2008 | Jeong et al. .......... | 345/84 |
| 2009/0262051 A1* | 10/2009 | Kim .......... | G09G 3/3266 345/80 |
| 2010/0171689 A1* | 7/2010 | Jeong .......... | G11C 19/18 345/100 |
| 2011/0115835 A1* | 5/2011 | Lee .......... | 345/691 |
| 2011/0227884 A1 | 9/2011 | Chung | |
| 2012/0013588 A1* | 1/2012 | Chung .......... | G09G 3/3266 345/211 |
| 2012/0062525 A1* | 3/2012 | Kim .......... | 345/204 |
| 2012/0327131 A1 | 12/2012 | Jang | |
| 2013/0002630 A1* | 1/2013 | Lee et al. .......... | G09G 3/3266 345/211 |

FOREIGN PATENT DOCUMENTS

| | | |
|---|---|---|
| KR | 10-2011-0104320 A | 9/2011 |
| KR | 10-2013-0000020 A | 1/2013 |

* cited by examiner

*Primary Examiner* — Long D Pham
(74) *Attorney, Agent, or Firm* — Lee & Morse, P.C.

(57) ABSTRACT

A stage circuit includes an outputting unit having a first node and a second node, the output unit configured to supply a voltage of a first power supply or a voltage of a third input terminal to an output terminal in accordance with voltages applied to the first node and the second node, a first driver configured to control the voltage of the second node in accordance with signals of a first input terminal, a second input terminal, and the third input terminal, and a second driver configured to control the voltage of the first node in accordance with the signal of the second input terminal and the voltage of the second node.

28 Claims, 7 Drawing Sheets

STAGE CIRCUIT AND ORGANIC LIGHT EMITTING DISPLAY USING THE SAME

CROSS-REFERENCE TO RELATED APPLICATION

The present application claims priority under 35 U.S.C. §119 to Korean Patent Application No. 10-2012-0104512, filed on Sep. 20, 2012, in the Korean Intellectual Property Office, and entitled: "Stage Circuit and Organic Light Emitting Display Using the Same," which is incorporated by reference herein in its entirety.

BACKGROUND

1. Field

Embodiments relate to a stage circuit and an organic light emitting display using the same.

2. Description of the Related Art

Recently, various flat panel displays (FPD) capable of reducing weight and volume that are disadvantages of cathode ray tubes (CRT) have been developed. The FPDs include liquid crystal displays (LCD), field emission displays (FED), plasma display panels (PDP), and organic light emitting displays.

Among the FPDs, the organic light emitting displays display images using organic light emitting diodes (OLED) that generate light by re-combination of electrons and holes. Organic light emitting displays have high response speeds and low power consumption. A typical organic light emitting display supplies currents corresponding to data signals to OLEDs using transistors formed in pixels so that the OLEDs may emit light.

Conventional organic light emitting display includes a data driver for supplying data signals to data lines, a scan driver for sequentially supplying scan signals to scan lines, and a pixel unit including a plurality of pixels coupled to the scan lines and the data lines.

The pixels included in the pixel unit are selected when the scan signals are supplied to the scan lines to receive the data signals from the data lines. The pixels that receive the data signals generate light components with predetermined brightness components corresponding to the data signals to display an image.

The scan driver includes stage circuits coupled to the scan lines. The stages supply the scan signals to the scan lines coupled thereto to correspond to signals supplied thereto.

SUMMARY

One or more embodiments are directed to providing a stage circuit, including an outputting unit having a first node and a second node, the outputting unit being configured to supply a voltage of a first power supply or a voltage of a third input terminal to an output terminal in accordance with voltages applied to the first node and the second node, a first driver configured to control the voltage of the second node in accordance with signals of a first input terminal, a second input terminal, and the third input terminal, and a second driver configured to control the voltage of the first node in accordance with the signal of the second input terminal and the voltage of the second node.

The first input terminal may receive an output signal of a previous stage or a start signal. The second input terminal may receive a first clock signal. The third input terminal may receive a second clock signal. The first clock signal and the second clock signal have the same period and have phases that do not overlap. The first clock signal and the second clock signal may have a period of two horizontal periods 2H and may be supplied in different horizontal periods as low signals. The start signal may be supplied to overlap the first clock signal.

The first driver may include a first transistor positioned between the first input terminal and the second node, the first transistor having a gate electrode coupled to the second input terminal, and a second transistor and a third transistor serially positioned between the second node and the first power supply. The gate electrode of the second transistor may be coupled to the third input terminal and the gate electrode of the third transistor may be coupled to the first node.

The outputting unit may include a fourth transistor positioned the first power supply and the output terminal, the fourth transistor having a gate electrode coupled to the first node, a fifth transistor coupled between the output terminal and the third input terminal, the fifth transistor having a gate electrode coupled to the second node, a first capacitor coupled between the second node and the output terminal, and a second capacitor coupled between the first node and the first power supply.

The second driver may include a sixth transistor positioned between the first node and the second input terminal, the sixth transistor having a gate electrode coupled to the second node, and a seventh transistor positioned between the first node and a second power supply, having a lower voltage than the first power supply, the seventh transistor having a gate electrode coupled to the second input terminal.

The second driver may include a sixth transistor between the first node and the second input terminal, the sixth transistor having a gate electrode coupled to the second node, and a seventh transistor coupled between the first node and the second input terminal, the seventh transistor being diode connected. The seventh transistor is coupled so that a current may flow from the first node to the second input terminal.

The stage circuit may further include a bidirectional driver coupled to the first input terminal, a fifth input terminal, and the first driver.

The bidirectional driver may include a tenth transistor between the first input terminal and the first driver, the tenth transistor being turned on when a first control signal is supplied, and an eleventh transistor between the fifth input terminal and the first driver, the eleventh transistor being turned on when a second control signal is supplied. The first input terminal may receive an output signal of a previous stage or a start signal and the fifth input terminal may receive an output signal of a next stage or a start signal.

One or more embodiments are directed to an organic light emitting display, including pixels positioned in regions partitioned by scan lines and data lines, a data driver for supplying data signals to the data lines, and a scan driver including stages coupled to the scan lines in order to supply scan signals to the scan lines. Each of the stages may include an outputting unit having a first node and a second node, the outputting unit being configured to supply a voltage of a first power supply or a voltage of a third input terminal to an output terminal in accordance with voltages applied to the first node and the second node, a first driver configured to control the voltage of the second node in accordance with signals of a first input terminal, a second input terminal, and the third input terminal, and a second driver configured to control the voltage of the first node in accordance with the signal of the second input terminal and the voltage of the second node.

A clock signal supplied to the third input terminal may be used as the scan signal. The first input terminal may receives a start signal or a scan signal of a previous stage. The second input terminals of odd stages may receive a first clock signal and the third input terminals of odd stages receive a second clock signal. The second input terminals of even stages may receive the second clock signal and the third input terminals of even stages receive the first clock signal. The first clock signal and the second clock signal may have the same period and may have phases that do not overlap.

The first driver may include a first transistor positioned between the first input terminal and the second node, the first transistor having a gate electrode coupled to the second input terminal, and a second transistor and a third transistor serially positioned between the second node and the first power supply. The gate electrode of the second transistor may be coupled to the third input terminal and the gate electrode of the third transistor may be coupled to the first node.

The outputting unit may include a fourth transistor positioned the first power supply and the output terminal, the fourth transistor having a gate electrode coupled to the first node, a fifth transistor coupled between the output terminal and the third input terminal, the fifth transistor having a gate electrode coupled to the second node, a first capacitor coupled between the second node and the output terminal, and a second capacitor coupled between the first node and the first power supply.

The second driver may include a sixth transistor positioned between the first node and the second input terminal, the sixth transistor having a gate electrode coupled to the second node, and a seventh transistor positioned between the first node and a second power supply, having a lower voltage than the first power supply, the seventh transistor having a gate electrode coupled to the second input terminal.

The second driver may include a sixth transistor between the first node and the second input terminal, the sixth transistor having a gate electrode coupled to the second node, and a seventh transistor coupled between the first node and the second input terminal, the seventh transistor being diode connected. The seventh transistor is coupled so that a current may flow from the first node to the second input terminal.

The stage circuit may further include a bidirectional driver coupled to the first input terminal, a fifth input terminal, and the first driver.

The bidirectional driver may include a tenth transistor between the first input terminal and the first driver, the tenth transistor being turned on when a first control signal is supplied, and an eleventh transistor between the fifth input terminal and the first driver, the eleventh transistor being turned on when a second control signal is supplied. The first input terminal may receive an output signal of a previous stage or a start signal and the fifth input terminal may receive an output signal of a next stage or a start signal.

The start signal or the scan signal of the previous stage supplied to the first input terminal may overlap the clock signal supplied to the second input terminal.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. Like reference numerals refer to like elements throughout.

It will also be understood that when an element is referred to as being "between", "connected to", or "coupled to" another element, it can be directly between, connected or coupled to the other element or intervening elements may be present. In contrast, when an element is referred to as being "directly between," "directly connected to", or "directly coupled to" another element, there are no intervening elements present.

Hereinafter, a stage circuit and an organic light emitting display using the same will be described in detail as follows with reference to FIGS. 1 to 7 in which exemplary embodiments by which those who skilled in the art may easily perform the present inventive concept are included.

Figure 1:
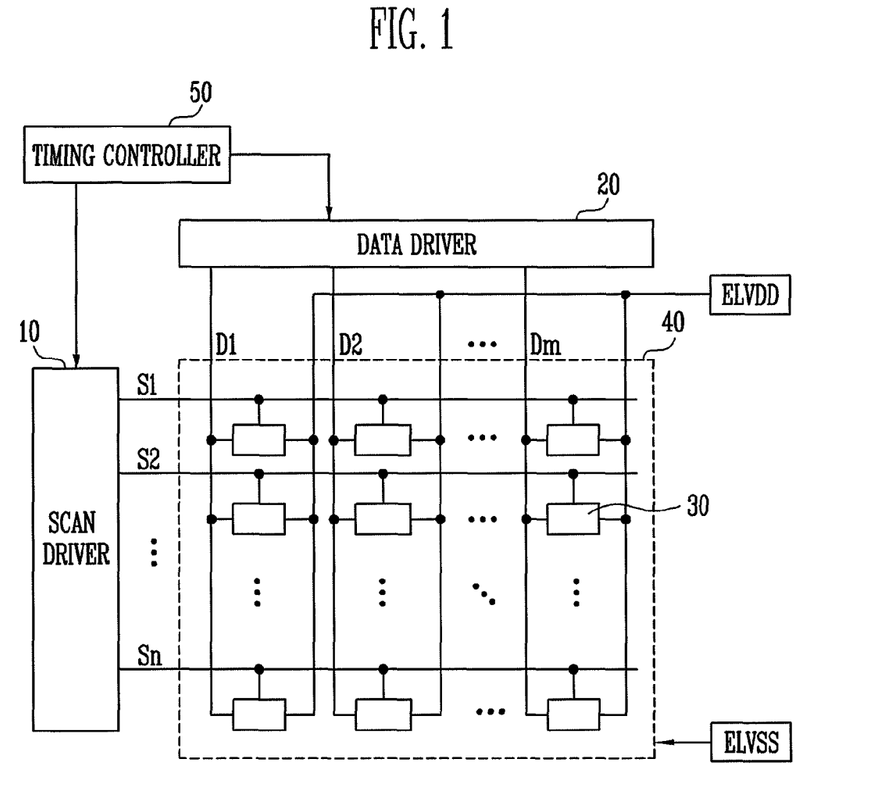
FIG. 1 illustrates a view of an organic light emitting display according to an embodiment.

FIG. 1 illustrates a view of an organic light emitting display according to an embodiment. Referring to FIG. 1, the organic light emitting display according to the embodiment includes a pixel unit 40 having pixels 30 positioned at the intersections of scan lines S1 to Sn and data lines D1 to Dm, a scan driver 10 for driving the scan lines S1 to Sn, a data driver 20 for driving the data lines D1 to Dm, and a timing controller 50 for controlling the scan driver 10 and the data driver 20.

The scan driver 10 supplies scan signals to the scan lines S1 to Sn. For example, the scan driver 10 may sequentially supply the scan signals to the scan lines S1 to Sn. In this case, the pixels 30 are selected in units of horizontal lines. For this purpose, the scan driver 10 includes a stage circuit (shown in FIG. 2) coupled to the scan lines S1 to Sn.

The data driver 20 supplies data signals to the data lines D1 to Dm in synchronization with the scan signals. Then, voltages corresponding to the data signals are charged in the pixels 30 selected by the scan signals.

The timing controller 50 controls the scan driver 10 and the data driver 20. In addition, the timing controller 50 transmits data (not shown) from the outside to the data driver 20.

The pixels 30 are selected when the scan signals are supplied to charge the voltages corresponding to the data signals and supply currents corresponding to the charged voltages to organic light emitting diodes (not shown) to generate light components with predetermined brightness components.

Figure 2:
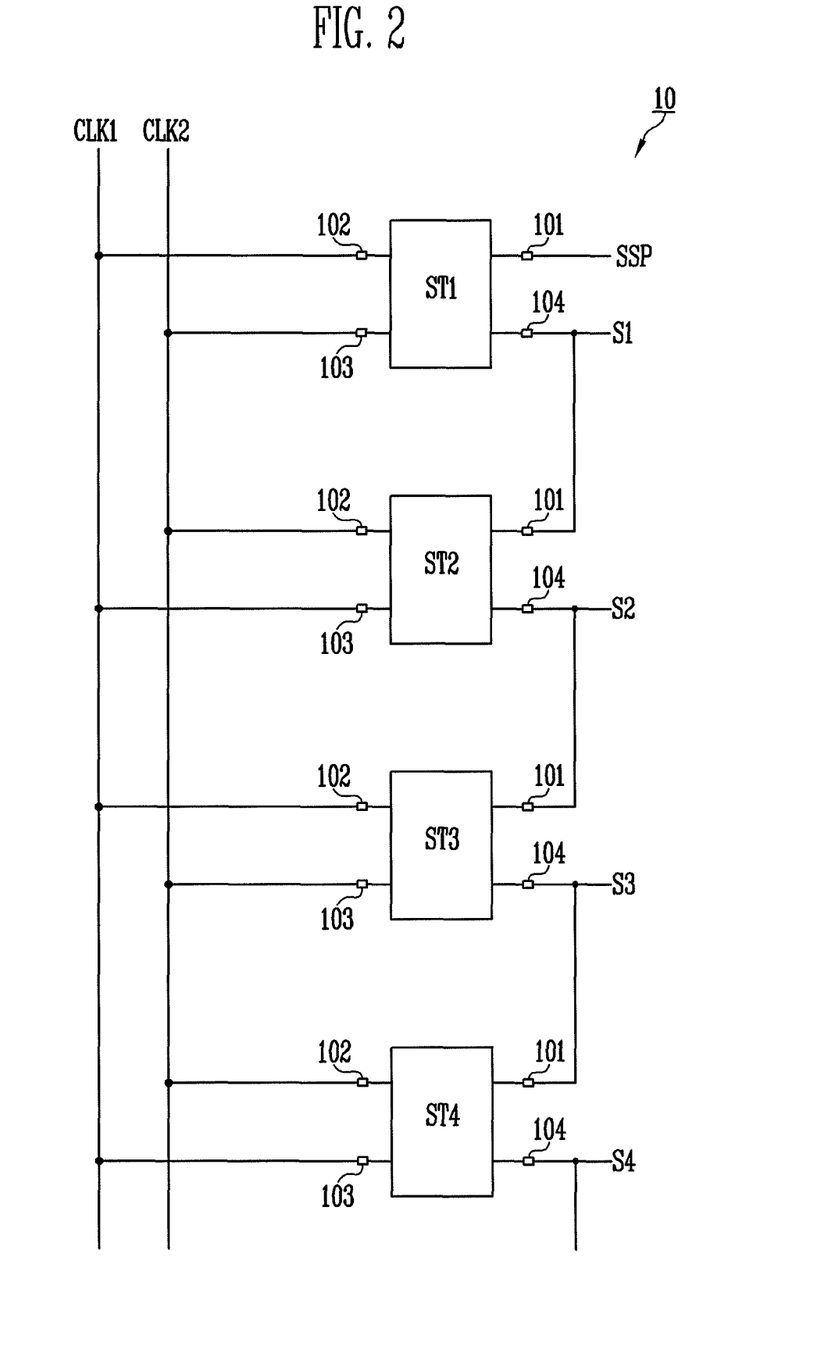
FIG. 2 illustrates a view of an embodiment of the scan driver illustrated in FIG. 1.

FIG. 2 illustrates a view of an embodiment of the scan driver illustrated in FIG. 1. In FIG. 2, for convenience, four stages will be illustrated.

Referring to FIG. 2, the scan driver 10 includes a plurality of stages ST1 to ST4. The stages ST1 to ST4 are coupled to the scan lines S1 to S4, respectively, and are driven in accordance with clock signals CLK1 and CLK2. The stages ST1 to ST4 may have the same circuit layout. Each of the stages ST1 to ST4 includes a first input terminal 101 to a third input terminal 103 and an output terminal 104.

The first input terminal 101 of each of the stages ST1 to ST4 receives the output signal, i.e., the scan signal, of a previous stage or a start signal SSP. For example, the first input terminal 101 of the first stage ST1 receives the start signal SSP and the first input terminals 101 of the remaining stages ST2 to ST4 receive the output signal of the previous stage.

The second input terminal 102 of an ith (i is odd or even) stage STi receives the first clock signal CLK1 and the third input terminal 103 of the ith stage STi receives the second clock signal CLK2. The second input terminal 102 of an (i+1)th stage STi receives the second clock signal CLK2 and the third input terminal 103 of the (i+1)th stage STi receives the first clock signal CLK1.

The first clock signal CLK1 and the second clock signal CLK2 have the same period and have phases that do not overlap. For example, when a period in which a scan signal is supplied to one scan line is referred to as a 1 horizontal period 1H, the clock signals CLK1 and CLK2 have periods of 2H and are supplied in different horizontal periods. In particular, times when the first and second clock signals CLK1 and CLK2 are supplied, e.g., the first and second clock signals CLK1 and CLK2 have a low level, do not overlap, although times when the first and second clock signals CLK1 and CLK2 are not supplied may overlap, e.g., both the first and second clock signals CLK1 and CLK2 may have a high level at the same time.

Figure 3:
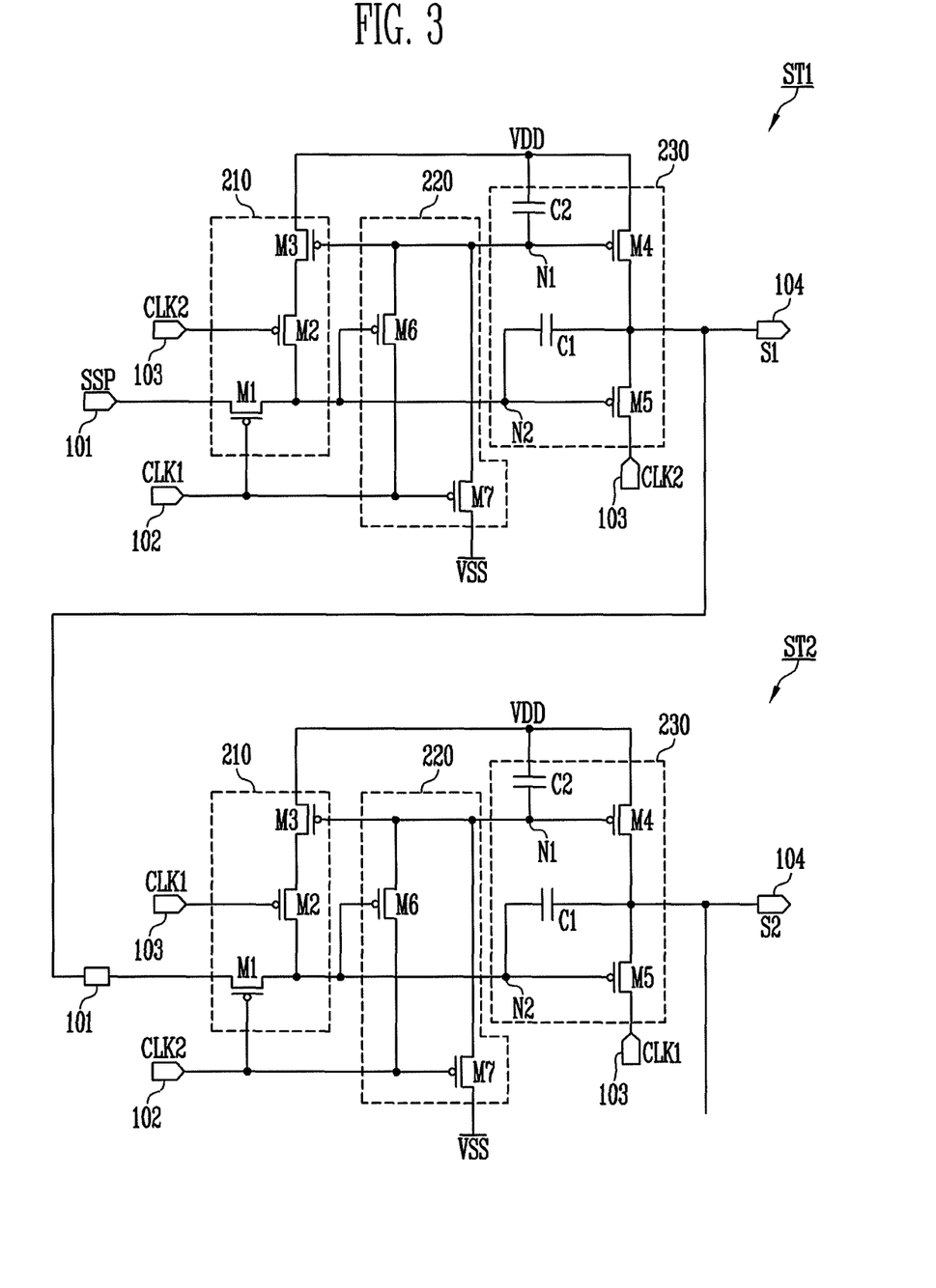
FIG. 3 illustrates a circuit diagram of a first embodiment of the stages illustrated in FIG. 2.

FIG. 3 illustrates a circuit diagram of a first embodiment of the stages illustrated in FIG. 2. In FIG. 3, for convenience, the first stage ST1 and the second stage ST2 will be illustrated. In FIG. 3, transistors are PMOS transistors. However, embodiments are not limited to the above. For example, the transistors may be NMOS transistors. Referring to FIG. 3, the stage ST1 according to the first embodiment includes a first driver 210, a second driver 220, and an outputting unit 230.

The outputting unit 230 controls a voltage supplied to the output terminal 104 in accordance with voltages applied to a first node N1 and a second node N2. For this purpose, the outputting unit 230 includes a fourth transistor M4, a fifth transistor M5, a first capacitor C1, and a second capacitor C2.

The fourth transistor M4 is positioned between a first power supply VDD and the output terminal 104. A gate electrode of the fourth transistor M4 is coupled to the first node N1. The fourth transistor M4 controls coupling between the first power supply VDD and the output terminal 104 in accordance with the voltage applied to the first node N1. Here, the first power supply VDD is set as a gate off voltage, for example, a high level voltage.

The fifth transistor M5 is positioned between the output terminal 104 and the third input terminal 103. A gate electrode of the fifth transistor M5 is coupled to the second node N2. The fifth transistor M5 controls coupling between the output terminal 104 and the third input terminal 103 in accordance with the voltage applied to the second node N2.

The first capacitor C1 is coupled between the second node N2 and the output terminal 104. The first capacitor C1 charges the voltage corresponding to turn on and off of the fifth transistor M5.

The second capacitor C2 is coupled between the first node N1 and the first power supply VDD. The second capacitor C2 charges the voltage applied to the first node N1.

The first driver 210 controls the voltage of the second node N2 in accordance with signals supplied to the first input terminal 101 to the third input terminal 103. For this purpose, the first driver 210 includes a first transistor M1, a second transistor M2, and a third transistor M3.

The first transistor M1 is positioned between the first input terminal 101 and the second node N2. A gate electrode of the first transistor M1 is coupled to the second input terminal 102. The first transistor M1 controls coupling between the first input terminal 101 and the second node N2 in accordance with the voltage supplied to the second input terminal 102.

The second transistor M2 and the third transistor M3 are serially coupled between the second node N2 and the first power supply VDD. In particular, the second transistor M2 is positioned between the third transistor M3 and the second node N2. A gate electrode of the second transistor M2 is coupled to the third input terminal 103. The second transistor M2 controls coupling between the third transistor M3 and the second node N2 in accordance with the voltage supplied to the third input terminal 103.

The third transistor M3 is positioned between the second transistor M2 and the first power supply VDD. A gate electrode of the third transistor M3 is coupled to the first node N1. The third transistor M3 controls coupling between the second transistor M2 and the first power supply VDD in accordance with the voltage of the first node N1.

The second driver 220 controls the voltage of the first node N1 in accordance with signals supplied to the second input terminal 102 and the second node N2. For this purpose, the second driver 220 includes a sixth transistor M6 and a seventh transistor M7.

The sixth transistor M6 is positioned between the first node N1 and the second input terminal 102. A gate electrode of the sixth transistor M6 is coupled to the second node N2. The sixth transistor M6 controls coupling between the first node n1 and the second input terminal 102 in accordance with the voltage of the second node N2.

The seventh transistor M7 is positioned between the first node N1 and a second power supply VSS. A gate electrode of the seventh transistor M7 is coupled to the second input terminal 102. The seventh transistor M7 controls coupling between the first node N1 and the second power supply VSS in accordance with the voltage of the second input terminal 102. Here, the second power supply VSS is set as a gate on voltage, e.g., a low level voltage.

Figure 4:
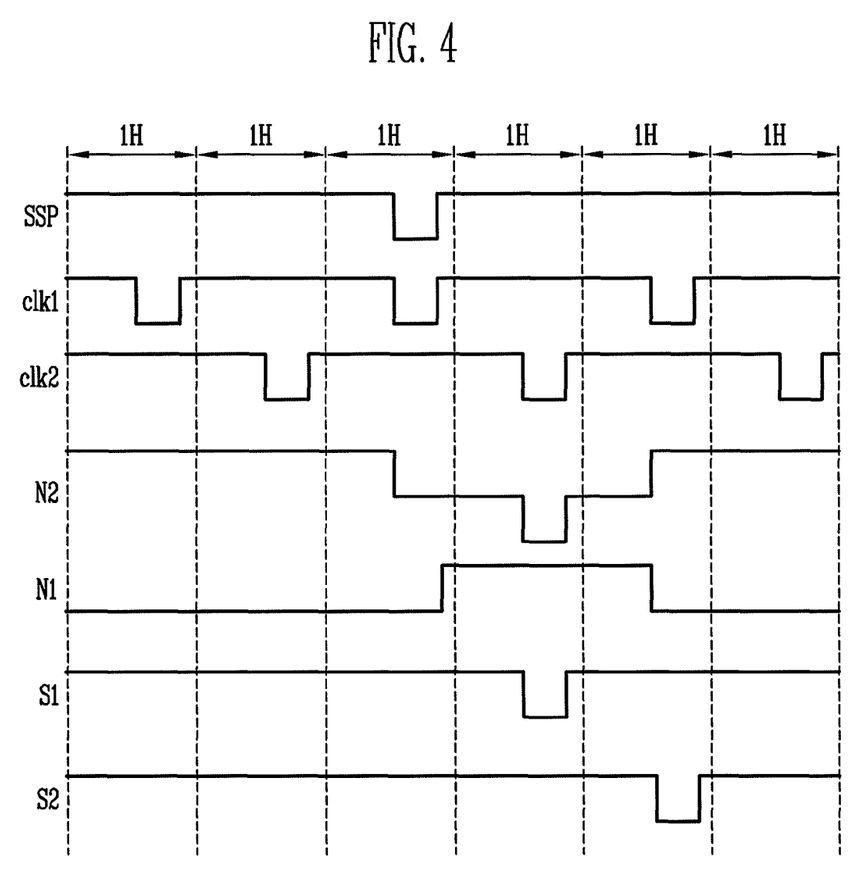
FIG. 4 illustrates a waveform diagram of a method of driving the stage circuits illustrated in FIG. 3.

FIG. 4 illustrates a waveform diagram of a method of driving the stage circuits illustrated in FIG. 3. In FIG. 4, for convenience, operation processes will be described using the first stage ST1.

Referring to FIG. 4, the first clock signal CLK1 and the second clock signal CLK2 have two horizontal periods and are supplied in different horizontal periods. The start signal SSP (or the output signal of the previous stage) is supplied in synchronization with the clock signal CLK1 or CLK2 supplied to the second input terminal 102.

In detail, during a third horizontal period, the start signal SSP is supplied in synchronization with the first clock signal CLK1. When the first clock signal CLK1 is supplied, the first transistor M1 and the seventh transistor M7 are turned on. When the first transistor M1 is turned on, the first input terminal 101 and the second node N2 are electrically coupled to each other. In this case, the second node N2 is set to be at a low voltage by the start signal SSP supplied to the first input terminal 101. When the second node N2 is set to be at the low voltage, the fifth transistor M5 and the sixth transistor M6 are turned on.

When the fifth transistor M5 is turned on, the third input terminal 103 and the output terminal 104 are electrically coupled to each other. Here, the third input terminal 103 is set to be at a high voltage, i.e., the second clock signal CLK2, so that the high voltage is output to the output terminal 104. When the sixth transistor M6 is turned on, the second input terminal 102 and the first node N1 are electrically coupled to each other. Then, the voltage of the first clock signal CLK1 supplied to the second input terminal 102, that is, a low voltage is supplied to the first node N1. Additionally, since the seventh transistor M7 is turned on, the voltage of the second power supply VSS is supplied to the first node N1. Here, the voltage of the second power supply VSS is set as the same voltage as (or a similar voltage to) the first clock signal CLK1 so that the first node N1 stably maintains the low voltage.

When the low voltage is supplied to the first node N1, the fourth transistor M4 and the third transistor M3 are turned on. When the third transistor M3 is turned on, the first power supply VDD and the second transistor M2 are electrically coupled to each other. Here, since the second transistor M2 is set to be in a turn off state, although the third transistor M3 is turned on, the second node N2 stably maintains the low voltage. When the fourth transistor M4 is turned on, the voltage of the first power supply VDD is supplied to the output terminal 104. Here, the voltage of the first power supply VDD is set as the same voltage as the high voltage supplied to the third input terminal 103 so that the output terminal 104 stably maintains the high voltage.

Then, supply of the start signal SSP and the first clock signal CLK1 is stopped. When the supply of the first clock signal CLK1 is stopped, the first transistor M1 and the seventh transistor M7 are turned off. At this time, the fifth transistor M5 and the sixth transistor M6 maintain a turn on state in accordance with the voltage stored in the first capacitor C1.

When the fifth transistor M5 maintains the turn on state, the output terminal 104 and the third input terminal 103 maintain electric coupling. Therefore, the output terminal 104 receives the high voltage from the third input terminal 103.

On the other hand, since the sixth transistor M6 maintains the turn on state, the first node N1 and the second input terminal 102 are electrically coupled to each other. Here, the voltage of the second input terminal 102 is set as a high voltage as the supply of the first clock signal CLK1 is stopped so that the first node N1 is set to be at the high voltage. When the high voltage is supplied to the first node N1, the fourth transistor M4 is turned off.

Then, in the fourth horizontal period, the second clock signal CLK2 is supplied to the third input terminal 103. At this time, since the fifth transistor M5 is set to be in the turn on state, the second clock signal CLK2 supplied to the third input terminal 103 is supplied to the output terminal 104. In this case, the output terminal 104 outputs the second clock signal CLK2 as a scan signal to the scan line S1.

After the scan signal is output to the scan line S1, the first clock signal CLK1 is supplied in the fifth horizontal period. When the first clock signal CLK1 is supplied, the first transistor M1 and the seventh transistor M7 are turned on. When the fifth transistor M1 is turned on, the first input terminal 101 and the second node N2 are electrically coupled to each other. At this time, the start signal SSP is not supplied to the first input terminal 101 so that the first input terminal 101 is set to be at the high voltage. Therefore, when the first transistor M1 is turned on, the high voltage is supplied to the second node N2 so that the fifth transistor M5 and the sixth transistor M6 are turned off.

When the seventh transistor M7 is turned on, the second power supply VSS is supplied to the first node N1 so that the third transistor M3 and the fourth transistor M4 are turned on. When the fourth transistor M4 is turned on, the voltage of the first power supply VDD is supplied to the output terminal 104. Then, the fourth transistor M4 and the third transistor M3 maintain a turn on state in accordance with the voltage charged in the second capacitor C2 so that the output terminal 104 stably receives the voltage of the first power supply VDD.

In addition, when the second clock signal CLK2 is supplied, the second transistor M2 is turned on. At this time, since the third transistor M3 is set to be in the turn on state, the voltage of the first power supply VDD is supplied to the second node N2. In this case, the fifth transistor M5 and the sixth transistor M6 stably maintain a turn off state.

The second stage ST2 receives the output signal (that is, the scan signal) of the first stage ST1 in synchronization with the second clock signal CLK2. In this case, the second stage ST2 outputs the scan signal to the second scan line S2 in synchronization with the first clock signal CLK1 during the fifth horizontal period. In practice, the stages ST repeat the above-described processes to sequentially output the scan signals to the scan lines.

Figure 5:
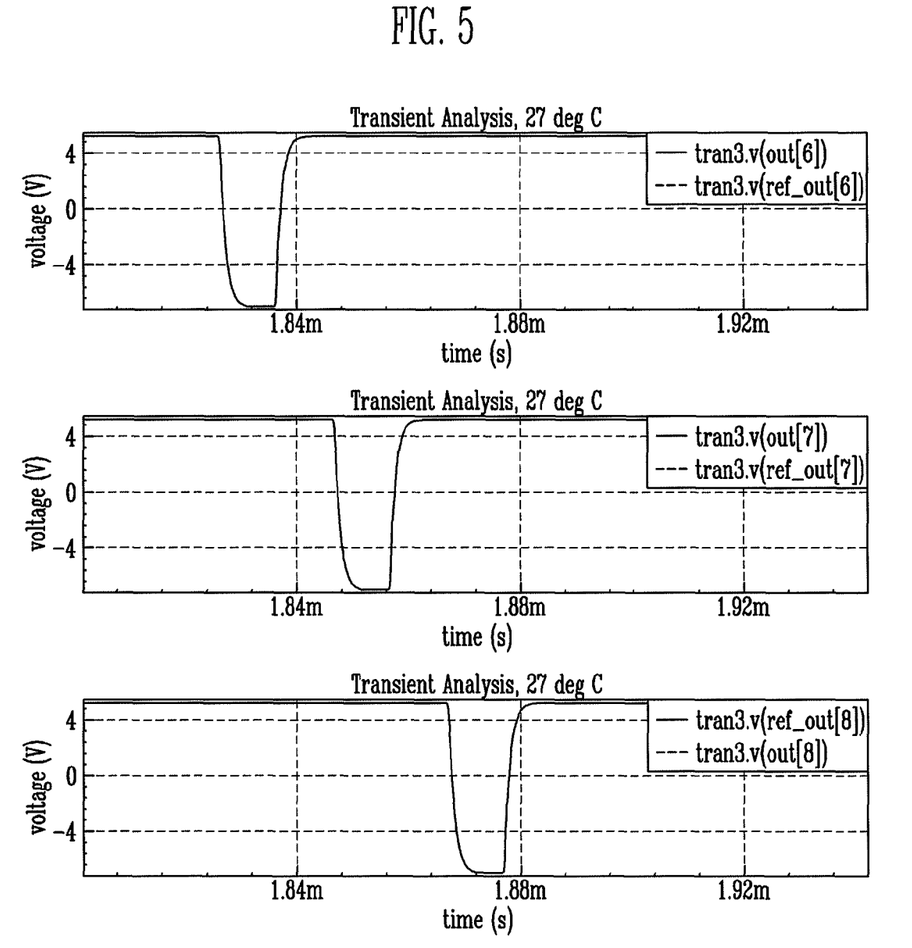
FIG. 5 illustrates a waveform diagram of simulation results of the stage circuits of FIG. 3.

FIG. 5 illustrates a waveform diagram of simulation results of the stage circuits of FIG. 3. Referring to FIG. 5, the scan driver using the stage circuits according to the first embodiment sequentially supplies the scan signals to the scan lines. In addition, the stage circuits according to the first embodiment output the scan signals to the scan lines using only the first clock signal CLK1 and the second clock signal CLK2. That is, the stage circuits according to the present invention do not receive additional initializing signals so that the width of the scan signals may be set to be large (for example, 1H).

Figure 6:
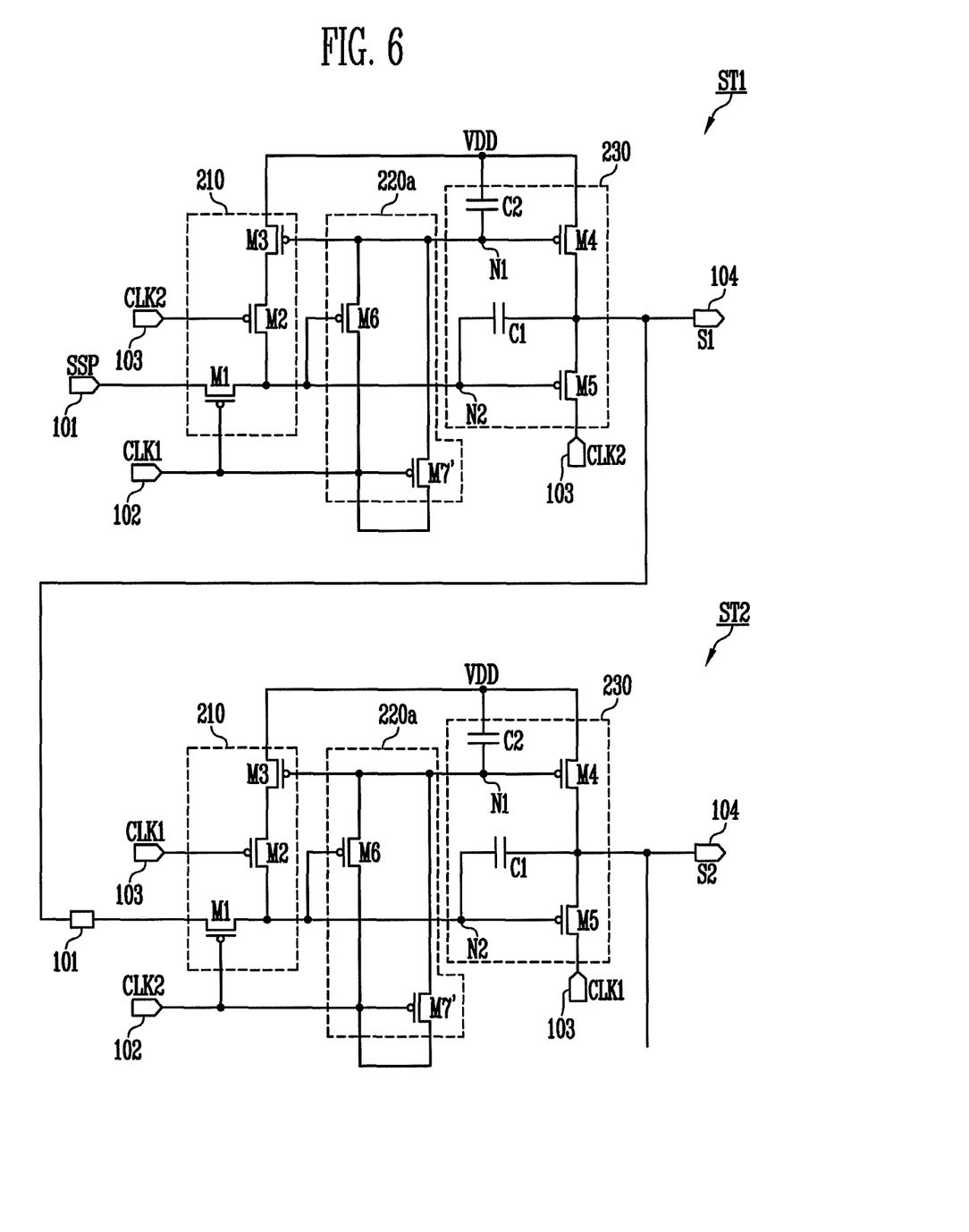
FIG. 6 illustrates a circuit diagram of stages according to a second embodiment.

FIG. 6 illustrates a circuit diagram of stages according to a second embodiment. In FIG. 6, the same elements as those of FIG. 3 will be denoted by the same reference numerals and detailed description thereof will not be repeated.

Referring to FIG. 6, in the stage according to the second embodiment, a second driver 220a includes a seventh transistor M7' diode-connected between the first node N1 and the second input terminal 102. That is, the seventh transistor M7' is diode-connected so that a current may flow from the first node N1 to the second input terminal 102. In this case, when a low voltage is supplied to the second input terminal 102, the voltage of the first node N1 is reduced to the low voltage. Since the other operation processes are the same as the operation processes of the stage according to the first embodiment, the operation processes will not be repeated.

Figure 7:
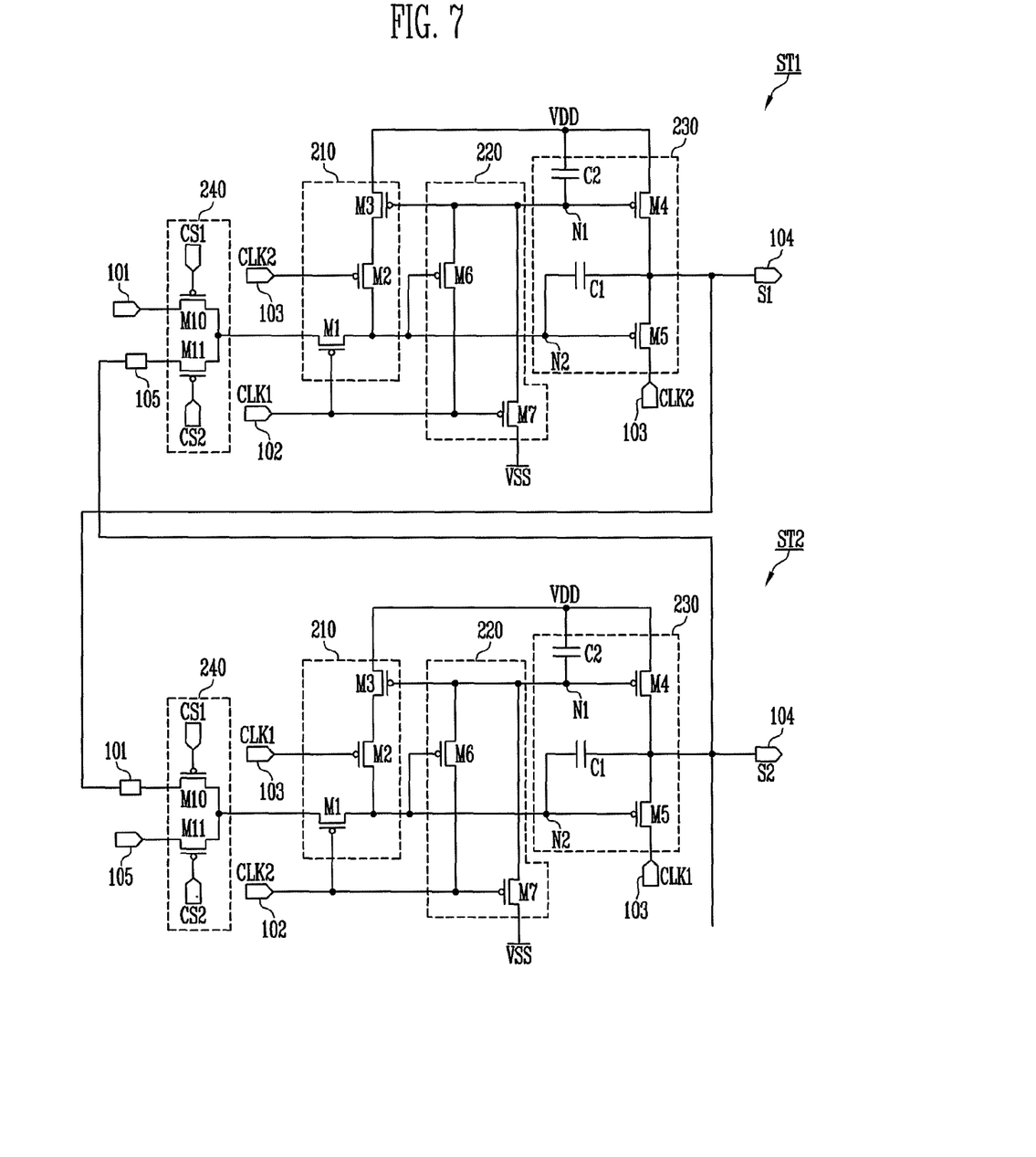
FIG. 7 illustrates a circuit diagram of stage circuits according to a third embodiment.

FIG. 7 illustrates a circuit diagram of stage circuits according to a third embodiment. In FIG. 7, the same elements as those of FIG. 3 are denoted by the same reference numerals and detailed description thereof will not be repeated.

Referring to FIG. 7, the stage circuit according to the third embodiment further includes a bidirectional driver 240. The bidirectional driver 240 performs control so that the scan signal may be supplied in a first direction (from the first scan line S1 to the nth scan line Sn) or in a second direction (from the nth scan line Sn to the first scan line S1). For this purpose, the bidirectional driver 240 includes a 10th transistor M10 and an 11th transistor M11.

The 10th transistor M10 is coupled between the first input terminal 101 and the first driver 210. The 10th transistor M10 is turned on when a first control signal CS1 is supplied. Here, the first input terminal 101 receives the scan signal of a previous stage (or the start signal).

The 11th transistor M11 is coupled between a fifth input terminal 105 and the first driver 210. The 11th transistor M11 is turned on when a second control signal CS2 is supplied. Here, the fifth input terminal 105 receives the scan signal of a next stage (or the start signal).

In describing operation processes, when the first control signal CS1 is supplied, the 10th transistor M10 is turned on. When the 10th transistor M10 is turned on, the stages are driven in accordance with the scan signal of the previous stage so that the scan signals are sequentially output in the first direction.

When the second control signal CS2 is supplied, the 11th transistor M11 is turned on. When the 11th transistor M11 is turned on, the stages are driven in accordance with the scan signals of the next stage so that the scan signals are output in the second direction. Since the other driving processes are the same as the driving processes of the stage according to the first embodiment, detailed description thereof will not be repeated.

By way of summation and review, embodiments provide stages having a reduced number of transistors and that output scan signals only using first and second clock signals. In contrast, conventional stage circuits includes a plurality of transistors, e.g., at least ten transistors, to supply the scan signals and/or require use of initializing signal in addition to the first and second clock signals. When a number of transistors in a stage increases, process yield deteriorates, so that stability of driving is deteriorated. When more initializing signals are required, there is less time for supplying scan signals, therey reducing stability. When a number of transistors is increased and/or more initializing signals are required, complexity increases. Therefore, stages according to embodiments, and an organic light emitting display using the same, improve stability and reduce complexity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A stage circuit having a first input terminal, a second input terminal, a third input terminal, and an output terminal, the stage circuit comprising:
    an outputting unit having a first node and a second node, the outputting unit to supply a voltage of a first power supply to the output terminal according to a voltage applied to the first node and a signal of the third input terminal to the output terminal according to a voltage applied to the second node;
    a first driver to control the voltage of the second node in accordance with signals of the first input terminal, the second input terminal, and the third input terminal; and
    a second driver to control the voltage of the first node in accordance with the signal of the second input terminal and the voltage of the second node, wherein
    the signal of the third input terminal directly controls an on/off operation of a transistor, the transistor included in the first driver.

2. The stage circuit as claimed in claim 1,
    wherein the first input terminal receives an output signal of a previous stage circuit or a start signal,
    wherein the second input terminal receives a first clock signal, and
    wherein the third input terminal receives a second clock signal.

3. The stage circuit as claimed in claim 2,
    wherein the first clock signal and the second clock signal have the same period and have phases that do not overlap.

4. The stage circuit as claimed in claim 3,
    wherein the first clock signal and the second clock signal have a period equal to two horizontal periods 2H and are supplied in different horizontal periods as low signals.

5. The stage circuit as claimed in claim 2, wherein the start signal is supplied to overlap the first clock signal.

6. The stage circuit as claimed in claim 2, wherein the first driver includes:
    a first transistor between the first input terminal and the second node, the first transistor having a gate electrode coupled to the second input terminal; and
    a second transistor and a third transistor serially positioned between the second node and the first power supply,
    wherein a gate electrode of the second transistor is coupled to the third input terminal, and
    wherein a gate electrode of the third transistor is coupled to the first node.

7. The stage circuit as claimed in claim 2, wherein the outputting unit includes:
    a fourth transistor between the first power supply and the output terminal, the fourth transistor having a gate electrode coupled to the first node;
    a fifth transistor between the output terminal and the third input terminal, the fifth transistor having a gate electrode coupled to the second node;
    a first capacitor between the second node and the output terminal; and
    a second capacitor between the first node and the first power supply.

8. The stage circuit as claimed in claim 2, wherein the second driver includes:
    a sixth transistor between the first node and the second input terminal, the sixth transistor having a gate electrode coupled to the second node; and
    a seventh transistor between the first node and a second power supply, the second power supply having a lower voltage than the first power supply, the seventh transistor having a gate electrode coupled to the second input terminal.

9. The stage circuit as claimed in claim 2, wherein the second driver includes:
    a sixth transistor between the first node and the second input terminal, the sixth transistor having a gate electrode coupled to the second node; and
    a seventh transistor between the first node and the second input terminal, the seventh transistor being diode connected.

10. The stage circuit as claimed in claim 9, wherein the seventh transistor is coupled so that a current flows from the first node to the second input terminal.

11. The stage circuit as claimed in claim 1, further comprising a bidirectional driver coupled to the first input terminal, a fifth input terminal, and the first driver.

12. The stage circuit as claimed in claim 11, wherein the bidirectional driver includes:
    a tenth transistor positioned between the first input terminal and the first driver, the tenth transistor being turned on when a first control signal is supplied; and
    an eleventh transistor positioned between the fifth input terminal and the first driver, the eleventh transistor being turned on when a second control signal is supplied.

13. The stage circuit as claimed in claim 12,
wherein the first input terminal receives an output signal of a previous stage circuit or a start signal, and
wherein the fifth input terminal receives an output signal of a next stage circuit or a start signal.

14. The stage circuit as claimed in claim 1, wherein the transistor controls the voltage of the second node according to the on/off operation thereof.

15. An organic light emitting display, comprising:
pixels positioned in regions partitioned by scan lines and data lines;
a data driver for supplying data signals to the pixels through the data lines; and
a scan driver for supplying scan signals to the pixels through the scan lines, the scan driver including stage circuits coupled to the scan lines, each of the stage circuits generating a corresponding scan signal of the scan signals and having a first input terminal, a second input terminal, a third input terminal, and an output terminal,
wherein each of the stage circuits includes:
an outputting unit having a first node and a second node, the outputting unit to supply a voltage of a first power supply to the output terminal according to a voltage applied to the first node and a signal of the third input terminal to the output terminal according to a voltage applied to the second node,
a first driver to control the voltage of the second node in accordance with signals of the first input terminal, the second input terminal, and the third input terminal, and
a second driver to control the voltage of the first node in accordance with the signal of the second input terminal and the voltage of the second node, wherein
the signal of the third input terminal directly controls an on/off operation of a transistor, the transistor included in the first driver.

16. The organic light emitting display as claimed in claim 15, wherein a clock signal supplied to the third input terminal is used as the scan signal.

17. The organic light emitting display as claimed in claim 15, wherein the first input terminal receives a scan signal of a previous stage circuit or a start signal.

18. The organic light emitting display as claimed in claim 17,
wherein second input terminals of odd stage circuits receive a first clock signal and third input terminals of odd stage circuits receive a second clock signal, and
wherein second input terminals of even stage circuits receive the second clock signal and third input terminals of even stage circuits receive the first clock signal.

19. The organic light emitting display as claimed in claim 18, wherein the first clock signal and the second clock signal have the same period and have phases that do not overlap.

20. The organic light emitting display as claimed in claim 18, wherein the first driver includes:
a first transistor between the first input terminal and the second node, the first transistor having a gate electrode coupled to the second input terminal; and
a second transistor and a third transistor serially positioned between the second node and the first power supply,
wherein a gate electrode of the second transistor is coupled to the third input terminal, and
wherein a gate electrode of the third transistor is coupled to the first node.

21. The organic light emitting display as claimed in claim 18, wherein the outputting unit includes:
a fourth transistor between the first power supply and the output terminal, the fourth transistor having a gate electrode coupled to the first node;
a fifth transistor between the output terminal and the third input terminal, the fifth transistor having a gate electrode coupled to the second node;
a first capacitor between the second node and the output terminal; and
a second capacitor between the first node and the first power supply.

22. The organic light emitting display as claimed in claim 18, wherein the second driver includes:
a sixth transistor between the first node and the second input terminal, the sixth transistor having a gate electrode coupled to the second node; and
a seventh transistor between the first node and a second power supply, the second power supply having a lower voltage than the first power supply, the seventh transistor having a gate electrode coupled to the second input terminal.

23. The organic light emitting display as claimed in claim 18, wherein the second driver includes:
a sixth transistor between the first node and the second input terminal, the sixth transistor having a gate electrode coupled to the second node; and
a seventh transistor between the first node and the second input terminal, the seventh transistor being diode connected.

24. The organic light emitting display as claimed in claim 23, wherein the seventh transistor is coupled so that a current flows from the first node to the second input terminal.

25. The organic light emitting display as claimed in claim 18, wherein the scan signal of the previous stage circuit or the start signal supplied to the first input terminal overlaps the clock signal supplied to the second input terminal.

26. The organic light emitting display as claimed in claim 15, further comprising a bidirectional driver coupled to the first input terminal, a fifth input terminal, and the first driver.

27. The organic light emitting display as claimed in claim 26, wherein the bidirectional driver includes:
a tenth transistor between the first input terminal and the first driver, the tenth transistor being turned on when a first control signal is supplied; and
an eleventh transistor between the fifth input terminal and the first driver, the eleventh transistor being turned on when a second control signal is supplied.

28. The organic light emitting display as claimed in claim 27,
wherein the first input terminal receives an output signal or a start signal of a previous stage circuit, and
wherein the fifth input terminal receives an output signal or a start signal of a next stage circuit.

* * * * *